(12) United States Patent
Abe

(10) Patent No.: US 6,715,135 B2
(45) Date of Patent: Mar. 30, 2004

(54) FORMAL VERIFICATION METHOD

(75) Inventor: Kenji Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 75 days.

(21) Appl. No.: 10/060,261

(22) Filed: Feb. 1, 2002

(65) Prior Publication Data

US 2002/0178425 A1 Nov. 28, 2002

(30) Foreign Application Priority Data

May 23, 2001 (JP) ........................................ 2001-154334

(51) Int. Cl.$^7$ .............................................. G06F 17/50
(52) U.S. Cl. ........................ 716/5; 716/2; 716/4; 716/17
(58) Field of Search ............................... 57/254; 716/2, 716/4, 5, 17

(56) References Cited

U.S. PATENT DOCUMENTS

| | | | | |
|---|---|---|---|---|
| 684,808 A | * | 10/1901 | Flower | 57/254 |
| 5,452,239 A | * | 9/1995 | Dai et al. | 716/17 |

OTHER PUBLICATIONS

Patent Abstracts of Japan of JP 09–114880 dated May 2, 1997.

* cited by examiner

*Primary Examiner*—Vuthe Siek
*Assistant Examiner*—Thuan Do
(74) *Attorney, Agent, or Firm*—Staas & Halsey LLP

(57) ABSTRACT

A plurality of input signals to be input to a logic circuit, a verification object, is ranked depending on the degrees of influence the input signals have when vary on operation of the logic circuit. Verification is performed with a free pattern including all possible input patterns given to the input signals sequentially in descending order of the degree of influence. That is, the input patterns are sequentially generated according to preset conditions (the degrees of influence). Therefore, even when forced termination of the formal verification occurs due to insufficient memory of a verification apparatus, the obtained verification results can be kept based on the degrees of influence. This allows easy analysis on the causes of the forced termination, and improvement in verification efficiency. It is possible to estimate the time taken for the completion of the entire verification and the required memory capacity of the verification apparatus.

5 Claims, 6 Drawing Sheets

| | (1) | (2) | (3) | (4) | (5) | (6) | (7) | (8) | (9) |
|---|---|---|---|---|---|---|---|---|---|
| IN-A | 0 | 0 | 0 | 0 | 1 | 1 | 1 | 1 | 0 |
| IN-B | 0 | 0 | 1 | 1 | 0 | 0 | 1 | 1 | 0 |
| IN-C | 0 | 1 | 0 | 1 | 0 | 1 | 0 | 1 | ? |
| verification result | OK | OK | OK | OK | OK | OK | OK | OK | OK |

| | (10) | (11) | (12) | (13) | (14) | (15) | (16) | (17) | (18) |
|---|---|---|---|---|---|---|---|---|---|
| IN-A | 0 | 1 | 1 | 0 | 0 | 1 | 1 | ? | ? |
| IN-B | 1 | 0 | 1 | ? | ? | ? | ? | 0 | 0 |
| IN-C | ? | ? | ? | 0 | 1 | 0 | 1 | 0 | 1 |
| verification result | OK | OK | OK | OK | OK | OK | OK | OK | OK |

| | (19) | (20) | (21) | (22) | (23) | (24) | (25) | (26) | (27) |
|---|---|---|---|---|---|---|---|---|---|
| IN-A | ? | ? | 0 | 1 | ? | ? | ? | ? | ? |
| IN-B | 1 | 1 | ? | ? | 0 | 1 | ? | ? | ? |
| IN-C | 0 | 1 | ? | ? | ? | ? | 0 | 1 | ? |
| verification result | OK | OK | OK | OK | OK | OK | NG | — | — |

Unable to verify

| input signal | degree of influence given on operation of logic circuit |
|---|---|
| IN-A | low |
| IN-B | ↕ |
| IN-C | high |

|      | (1) | (2) | (3) | (4) | (5) | (6) | (7) | (8) | (9) |
|------|-----|-----|-----|-----|-----|-----|-----|-----|-----|
| IN-A | 0   | 0   | 0   | 0   | 1   | 1   | 1   | 1   | 0   |
| IN-B | 0   | 0   | 1   | 1   | 0   | 0   | 1   | 1   | 0   |
| IN-C | 0   | 1   | 0   | 1   | 0   | 1   | 0   | 1   | ?   |

|      | (10) | (11) | (12) | (13) | (14) | (15) | (16) | (17) | (18) |
|------|------|------|------|------|------|------|------|------|------|
| IN-A | 0    | 1    | 1    | 0    | 0    | 1    | 1    | ?    | ?    |
| IN-B | 1    | 0    | 1    | ?    | ?    | ?    | ?    | 0    | 0    |
| IN-C | ?    | ?    | ?    | 0    | 1    | 0    | 1    | 0    | 1    |

|      | (19) | (20) | (21) | (22) | (23) | (24) | (25) | (26) | (27) |
|------|------|------|------|------|------|------|------|------|------|
| IN-A | ?    | ?    | 0    | 1    | ?    | ?    | ?    | ?    | ?    |
| IN-B | 1    | 1    | ?    | ?    | 0    | 1    | ?    | ?    | ?    |
| IN-C | 0    | 1    | ?    | ?    | ?    | ?    | 0    | 1    | ?    |

Fig. 3 combination(1)                                                    verification result
    IN- A(0) _____
    IN- B(0) _____  OK
    IN- C(0) _____ combination(9)
    IN- A(0) _____
    IN- B(0) _____  OK
    IN- C(?) ⎍⎍⎍⎍⎍ combination(13)
    IN- A(0) _____
    IN- B(?) ⎍⎍⎍⎍⎍                                      OK
    IN- C(0) _____ combination(17)
    IN- A(?) ⎍⎍⎍⎍
    IN- B(0) _____  OK
    IN- C(0) _____ combination(24)
    IN- A(?) ⎍⎍⎍⎍⎍
    IN- B(1) _____  OK
    IN- C(?) ⎍⎍⎍⎍⎍ combination(25)
    IN- A(?) ⎍⎍⎍⎍⎍
    IN- B(?) ⎍⎍⎍⎍⎍⎍                                     —
    IN- C(0) _____
                            Unable to verify due to insufficient memory

Fig. 5

|  | (1) | (2) | (3) | (4) | (5) | (6) | (7) | (8) | (9) |
|---|---|---|---|---|---|---|---|---|---|
| IN-A | 0 | 0 | 0 | 0 | 1 | 1 | 1 | 1 | 0 |
| IN-B | 0 | 0 | 1 | 1 | 0 | 0 | 1 | 1 | 0 |
| IN-C | 0 | 1 | 0 | 1 | 0 | 1 | 0 | 1 | ? |
| verification result | OK | OK | OK | OK | OK | OK | OK | OK | OK |

|  | (10) | (11) | (12) | (13) | (14) | (15) | (16) | (17) | (18) |
|---|---|---|---|---|---|---|---|---|---|
| IN-A | 0 | 1 | 1 | 0 | 0 | 1 | 1 | ? | ? |
| IN-B | 1 | 0 | 1 | ? | ? | ? | ? | 0 | 0 |
| IN-C | ? | ? | ? | 0 | 1 | 0 | 1 | 0 | 1 |
| verification result | OK | OK | OK | OK | OK | OK | OK | OK | OK |

|  | (19) | (20) | (21) | (22) | (23) | (24) | (25) | (26) | (27) |
|---|---|---|---|---|---|---|---|---|---|
| IN-A | ? | ? | 0 | 1 | ? | ? | ? | ? | ? |
| IN-B | 1 | 1 | ? | ? | 0 | 1 | ? | ? | ? |
| IN-C | 0 | 1 | ? | ? | ? | ? | 0 | 1 | ? |
| verification result | OK | OK | OK | OK | OK | OK | NG | — | — |

Unable to verify

Fig. 6

| input signal | |
|---|---|
| IN-A | low |
| IN-B | ↕ degree of influence given on operation of logic circuit |
| IN-C | high |
| RESET | [1][0]* |
| CLK2 | ([0]{2}[1]{2})* |

} regular expression

FORMAL VERIFICATION METHOD

BACKGROUND OF THE INVENTION

1. Field of the Invention

The present invention relates to a formal verification method for verifying the function of a logic circuit.

2. Description of the Related art

Semiconductor integrated circuits such as a system LSI are advancing in functionality and increasing in logic scale. Accordingly, the logic verification of the semiconductor integrated circuits tends to become increasingly greater both in verification scale and in verification time.

Recently, attention has been given to formal verification as one of the techniques for logic verification. The formal verification is one in which a logic circuit modeled, for example, in RTL expressions is converted into a finite state machine, followed by a mathematical proof that the specifications to be verified are satisfied. The formal verification is superior in exhaustiveness as compared to conventional simulation methods which take account of input patterns alone. Therefore, it is possible to detect errors which are hard to find in simulations.

The formal verification is, however, higher than logic simulations in computational complexity. Therefore, in handling a circuit model having a large number of states, the workstation executing the verification program can sometimes run out of memory capacity and becomes unable to verify. Upon a verification failure due to insufficient memory, the verification program is terminated forcefully. This has presented a problem of the absence of the verification results. That is, there has been a problem that when the verification program is terminated forcefully, it is impossible to confirm how far the verification has been made. In some cases, a formal verification requires an execution time as long as one week or so. Accordingly, forced termination can cause extremely heavy losses in terms of time and cost.

The scale of a circuit model capable of formal verification depends largely on the number of flip-flops contained in the model. Theory holds that the number of states of a circuit model is twice the increment of flip-flops. The memory capacity required for the verification also doubles accordingly. In the meantime, since the formal verification is characterized in the exhaustiveness of input patterns as mentioned above, it is difficult to estimate the memory capacity and the verification time required for the verification accurately. Therefore, simply adding a memory to the workstation will not always promise the proper execution of the formal verification until the end.

As mentioned above, the formal verification is extremely useful for verifying a logic circuit, whereas no consideration has been given to the forced termination owing to insufficient memory which is relatively likely to occur.

SUMMARY OF THE INVENTION

It is an object of the present invention to improve the efficiency of formal verification by keeping obtained verification results, in cases where forced termination of the verification occurs.

According to one of the aspects of the formal verification method in the present invention, a plurality of input signals to be input to a logic circuit as a verification object is ranked depending on the degrees of influence that the input signals have on operation of the logic circuit. Then, verification is performed with the input signals sequentially given free patterns including all possible input patterns in descending order of the degree of influence. That is, the input patterns are sequentially generated according to preset conditions (the degrees of influence). Therefore, even when the formal verification is forcefully terminated halfway due to such reasons as insufficient memory of a verification apparatus, the obtained verification results until the forced termination can be kept based on the degrees of influence mentioned above. As a result, the causes of the forced termination can be easily analyzed with improved verification efficiency. Since verification-completed input patterns and verification-failed input patterns are distinctive, it is possible to estimate the time taken for the completion of the entire verification and the memory capacity of the verification apparatus required for the verification.

According to another aspect of the formal verification method of the present invention, verification is performed first by giving any of the free patterns to each of the input signals. Thereafter, a plurality of combinations of the input signals is individually given the free patterns for verification, sequentially in descending order of the degree of influence that the combinations have. For example, even in the case where the memory capacity of the verification apparatus is unchanged, a larger number of combinations of input patterns can be verified by sequentially giving input patterns in order of complexity. As a result, it is possible to keep more varieties of verification records.

According to another aspect of the formal verification method in the present invention, each of the input signals other than the input signals given the free patterns is given an input pattern of either "logic 0 fixed" or "logic 1 fixed" for verification. That is, input signals having lower degrees of influence on the operation of the logic circuit are preferentially given either "logic 0 fixed" or "logic 1 fixed." Since the relationship between the preset conditions (the degrees of influence) and the generated input patterns becomes apparent, the causes of forced termination can be easily analyzed with improved verification efficiency.

According to another aspect of the formal verification method in the present invention, when any of the input signals has a fixed input pattern in the verification of the logic circuit, the input pattern is written in regular expressions. This can reduce the number of signals to be ranked, allowing a reduction in verification time. In addition, the input patterns can be generated easily.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 3 is an explanatory diagram showing an example of the combinations of the input patterns which a verification program generates in the first embodiment;

FIG. 5 is an explanatory diagram showing some of the waveforms of the input signals generated in a workstation and the verification results in the first embodiment;

FIG. 6 is an explanatory diagram showing an example of the verification results to be output from the workstation in the first embodiment;

DESCRIPTION OF THE PREFERRED EMBODIMENTS

Hereinafter, embodiments of the present invention will be described with reference to the drawings. FIGS. 1–5 show a first embodiment of the formal verification method in the present invention.

Figures 1, 2:
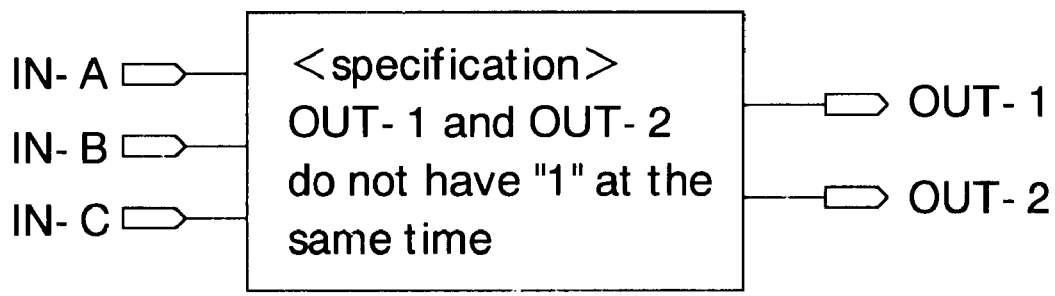
FIG. 1 is a block diagram showing an example of a logic circuit on which the formal verification is performed in a first embodiment.
FIG. 2 is a signal name list of input signals showing the ranking of the degrees of influence given on the operation of the logic circuit in the first embodiment.

FIG. 1 shows an example of a logic circuit (verification object) on which the formal verification is performed. This logic circuit is formed in a semiconductor integrated circuit such as a system LSI, for example. The logic circuit is specified so that its output signals OUT-1 and OUT-2 do not have "logic 1" at the same time when input signals IN-A, IN-B, and IN-C are supplied. Thus, the formal verification is to provide a mathematical proof that the output signals OUT-1 and OUT-2 do not have "logic 1" at the same time. The formal verification is performed, for example, by a verification program on a workstation.

FIG. 2 shows a signal name list corresponding to the input signals IN-A, IN-B, and IN-C. The signal name list is one in which the input signal signals IN-A, IN-B, and IN-C are ranked depending on the degrees of influence these input signals have on operation of the logic circuit. The signal name list is created by designers or verifiers who are thoroughly familiar with the logic circuit to be verified.

For example, input signals that may be fixed in logic value, such as an operation mode signal for setting the operation mode (normal operation mode, standby mode, test mode, etc.) of the system LSI, are ranked lower. Signals that reduce the significance of the verification if fixed in input level are ranked higher. An example of the signal to be ranked higher in priority is an interrupt signal. Note that the operation mode signal will be ranked higher if the verification aims at the operation of switching the operation mode.

Signals that make the verification useless if ranked are excluded from the signal name list. For example, when the verification is performed on the normal operation mode alone, a reset signal is excluded from the signal name list. Similarly, when the verification is performed on normal operations with the interrupt signal disabled, the interrupt signal is excluded from the signal list.

As described above, higher ranks are given to input signals that vary in logic level frequently or that vary in logic level irregularly during the operations in question (operations to be verified) out of the operations of the logic circuit. In contrast, lower ranks are given to input signals that vary little in logic level or that have little influence on the operations of the logic circuit during the operations in question (operations to be verified).

The signal name list created is input to the workstation for performing the verification. The verification program executed by the workstation sequentially generates input patterns with reference to the ranking in the signal name list, and performs verification.

FIG. 3 shows an example of the combinations of the input patterns which the verification program generates. The verification program gives "logic 0 fixed (expressed by "0" in the diagram)" and "logic 1 fixed (expressed by "1" in the diagram)" to input signals in sequence in ascending order of the degree of influence (combinations (1)–(8)).

Next, the verification program gives a "free pattern (expressed by "?" in the diagram)" to input signals sequentially in descending order of the degree of influence, with "logic 0 fixed" and "logic 1 fixed" given to the remaining input signals (combinations (9)–(12), (13)–(16), (17)–(20)). Here, the "free pattern" signifies all the possible input patterns given exhaustively.

Next, the verification program sequentially gives the "free pattern" to two input signals at a time in descending order of the degree of influence, with "logic 0 fixed" and "logic 1 fixed" given to the remaining input signals (combinations (21)–(22), (23)–(24), (25)–(26)).

In this way, according to the conditions (the degrees of influence) preset in the signal name list, the verification program generates input patterns while gradually increasing the number of input signals to be given the "free pattern." Then, the verification program gives the "free pattern" to all the input signals (combination (27)).

Assuming that the number of input signals to be verified is "n", the combinations of the input patterns are as many as the nth power of "3". In this example, the number of input signals is "3", which means twenty-seven combinations (1)–(27). Incidentally, in each of the seven groups consisting of the combinations (1)–(8), the combinations (9)–(12), the combinations (13)–(16), the combinations (17)–(20), the combinations (21)–(22), the combinations (23)–(24), and the combinations (25)–(26), the order of the combinations is not limited to what is shown in FIG. 3. For example, the group of the combinations (13)–(16) may be subjected to verification in order of (16) to (13).

The combination (27) for giving the free pattern to all the input signals corresponds to the input patterns used in conventional formal verification. Accordingly, in the present invention, the logic verifications that have been performed in a lump heretofore are performed separately in a plurality of combinations of input patterns depending on the degrees of influence which the input signals have on the circuit. Therefore, the verifiers/designers can confirm to which combination the verification is completed even when the verification program is terminated forcefully due to insufficient memory of the workstation.

Figure 4:
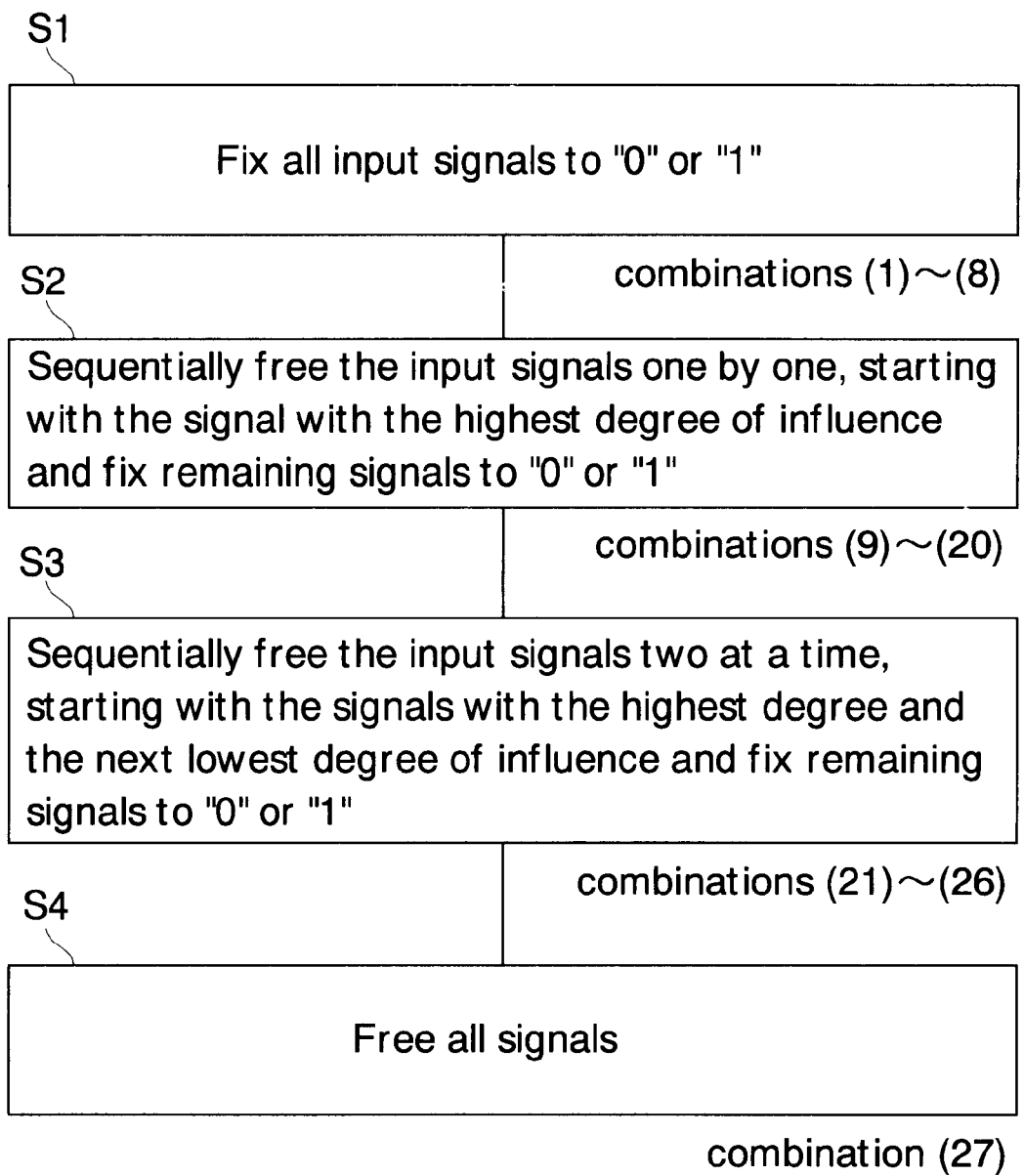
FIG. 4 is a flowchart showing the steps of verification for the verification program to execute in the first embodiment.

FIG. 4 shows the flow of verification for the workstation (verification program) to execute. The verification is performed in the order of the combinations (1) to (27) shown in FIG. 3 until the memory runs out.

Initially, at step S1, "logic 0 fixed" and "logic 1 fixed" are sequentially given to all the input signals IN-A, IN-B, and IN-C for verification. Step S1 corresponds to the combinations (1)–(8) shown in FIG. 3.

Next, as step S2, the "free pattern" is given to one of the input signals with the highest degree of influence, and "logic 0 fixed" or "logic 1 fixed" is given to the remaining input signals for verification. Step S2 corresponds to the combinations (9)–(20) shown in FIG. 3.

Next, as step S3, the "free pattern" is given to two of the input signals with the highest degree and the second highest degree of influence, and "logic 0 fixed" or "logic 1 fixed" is given to the remaining input signal for verification. Step S3 corresponds to the combinations (21)–(26) shown in FIG. 3. In this way, sequentially giving input patterns in order of complexity allows verification of a larger number of combinations of input patterns.

Finally, at step S4, the "free pattern" is given to all the input signals IN-A, IN-B, and IN-C for verification. Step S4 corresponds to the combination (27) shown in FIG. 3.

Incidentally, when the number of input signals is greater than "3", after step S3 the "free pattern" is sequentially given to a plurality of input signals in descending order of the degree of influence, and "logic 0 fixed" or "logic 1 fixed" is given to the remaining input signals for verification.

FIG. 5 shows some of the waveforms of the input signals IN-A, IN-B, and IN-C generated in the workstation during verification, along with the verification results. In this example, the workstation runs out of the memory capacity in verifying the combination (25), and becomes unable to execute the remainder of the verification. This proves, however, that the combinations (1)–(24) have been verified without problems, for the combinations of input patterns are determined on the basis of the signal name list created by the designers or others in advance. The clear distinction between the verification-completed input patterns (1)–(24) and the verification-failed input patterns (25)–(27) allows easy estimations of the time taken for the completion of the entire verification and the memory capacity required for the verification.

FIG. 6 shows an example of the verification results to be output from the workstation after the verification is discontinued due to insufficient memory capacity. "OK" in the verification result column indicates that the verification has been completed without problems. "NG" in the verification result column signifies that the memory is running out when this input pattern (combination (25)) is under verification, and the verification is discontinued. "–" in the verification result column indicates that verification cannot be performed on these patterns (combination (26), (27)).

When the formal verification is forcefully terminated halfway, the designers or others study the possibility of verifying any of the failed combinations that contain none of the succeeded combinations by means of logic simulations or the like, based on the results of the formal verification shown in FIG. 6. In addition, they predict the shortfall of memory from the verification-completed combinations, and consider the addition of memories if necessary.

As has been described, in the present embodiment, the input patterns are sequentially generated according to the preset conditions (the degrees of influence). Therefore, even when the formal verification is forcefully terminated halfway due to insufficient memory of the workstation, the obtained verification results until the termination can be kept based on the degrees of influence. That is, all the combinations of input signals where the verification has been completed can be kept as records. Consequently, when the verification result ends with "NG", the cause can be analyzed easily with improved verification efficiency.

The clear distinction between the verification-completed input patterns (for example, the combinations (1)–(24)) and the verification-failed input patterns (for example, the combinations (25)–(27)) allows estimations of the time taken for the completion of the entire verification and the memory capacity required for the verification.

Each of the input signals IN-A, IN-B, and IN-C is given the free pattern and subjected to verification before a plurality of input signals are sequentially given the free pattern for verification in descending order of the degree of influence. By sequentially giving such input patterns in order of complexity, a larger number of combinations of input patterns can be verified within the same memory capacity of the workstation. As a result, it is possible to keep more varieties of verification records.

Input signals not given the free pattern, i.e., input signals having lower degrees of influence on the operation of the logic circuit are preferentially given "logic 0 fixed" or "logic 1 fixed" for verification. Since the relationship between the preset conditions (degrees of influence) and generated input patterns becomes apparent, the cause of forced termination can be analyzed easily with improved verification efficiency.

Figures 7, 8:
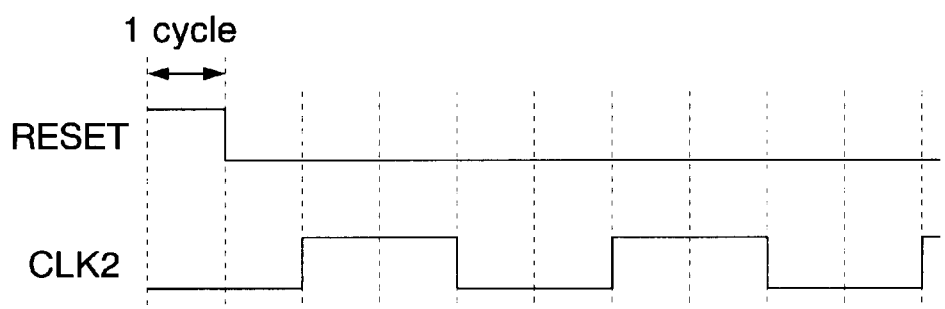
FIG. 7 is a signal name list of input signals showing the ranking of the degrees of influence given on the operation of the logic circuit in a second embodiment.
FIG. 8 is a waveform diagram showing the actual input patterns of the reset signal and the clock signal of FIG. 7.

FIGS. 7 and 8 show a second embodiment of the formal verification method in the present invention. The same elements as those described in the first embodiment will be designated by identical reference symbols. Detailed description thereof will be omitted here. The logic circuit on which the formal verification is performed (verification object) is formed in a semiconductor integrated circuit such as a system LSI, for example.

FIG. 7 shows a signal name list which contains input signals IN-A, IN-B, IN-C, RESET, and CLK2 to be input to the logic circuit. That is, in this embodiment, a reset signal RESET and a clock signal CLK2 are added to the signal name list of the first embodiment. The reset signal RESET and the clock signal CLK2 are ones having a fixed input pattern in the verification of the logic circuit of this embodiment. That is, the reset signal RESET and the clock signal CLK2 need to maintain waveforms of predetermined timing so that the logic circuit operates normally. In the signal name list, the input signal signals IN-A, IN-B, and IN-C are ranked depending on the degrees of influence these input signals have when vary on the operation of the logic circuit, as in the first embodiment.

As for the reset signal RESET and the clock signal CLK2, the input patterns of these signals are written in regular expressions. The symbols "[ ]" represent a logic level in a single cycle. The symbols "{ }" represent the number of repetitions. The symbol "*" signifies that the previous expression repeats infinitely.

For such signals maintaining a fixed input pattern in the verification of the logic circuit, their input patterns are written in regular expressions. In other words, signals that make the verification useless unless vary to certain logic levels are written in regular expressions. This can reduce the number of signals to be ranked, allowing a reduction in verification time. As in the first embodiment, the signal name list is created by designers or verifiers who are thoroughly familiar with the logic circuit to be verified.

FIG. 8 shows the actual input patterns of the reset signal RESET and the clock signal CLK2 which are written in regular expressions on the signal name list of FIG. 7. For the input patterns of the reset signal REST and the clock signal CLK2, the waveforms shown in FIG. 8 may be input to the workstation by the designers or others and converted into regular expressions by a program on the workstation. Alternatively, the designers themselves may write the input patterns in regular expressions and enter them to the workstation. That is, input patterns can be easily created of signals that maintain fixed input patterns.

This embodiment can offer the same effects as those obtained from the first embodiment described above. Moreover, in this embodiment, the input patterns of signals that maintain fixed input patterns may be written in regular expressions. This can reduce the number of signals to be ranked, allowing a reduction in verification time. In addition, the input patterns can be generated easily.

Incidentally, the foregoing embodiments have dealt with the cases where the verification program is executed by the workstation. However, the present invention is not limited to such embodiments. For example, the verification program may be executed by a personal computer.

The invention is not limited to the above embodiments and various modifications may be made without departing from the spirit and the scope of the invention. Any improvement may be made in part or all of the components.

What is claimed is:

1. A formal verification method comprising:

ranking a plurality of input signals to be input to a logic circuit as a verification object, the ranking being higher for the input signals that vary in logic level frequently or for the input signals that vary in logic level irregularly during operation of the logic circuit; and performing verification by providing all possible input patterns to each of the input signals sequentially in descending order of the ranking.

2. The formal verification method according to claim 1, wherein each of the input signals, other than the input signals provided all the possible input patterns, is provided an input pattern of either "logic 0 fixed" or "logic 1 fixed" for verification.

3. The formal verification method according to claim 1, wherein said performing verification comprises:

providing all the possible input patterns to each of the input signals; and providing all the possible input patterns, after said providing all the possible input patterns to each of the input signals, to a plurality of combinations of the input signals sequentially in descending order of the ranking of the combinations.

4. The formal verification method according to claim 3, wherein each of the input signals, other than the input signals provided all the possible input patterns, is given an input pattern of either "logic 0 fixed" or "logic 1 fixed" for verification.

5. The formal verification method according to claim 1, wherein when any of the input signals has a fixed input pattern in the verification of the logic circuit, the fixed input pattern is written in regular expressions.

* * * * *